(12) United States Patent
Michalk

(10) Patent No.: US 9,000,305 B2
(45) Date of Patent: Apr. 7, 2015

(54) CIRCUIT CONFIGURATION HAVING A PRESCRIBED CAPACITANCE, AND METHOD AND DEVICE FOR THE PRODUCTION THEREOF

(75) Inventor: Manfred Michalk, Erfurt (DE)

(73) Assignee: Smartrac IP B.V., Amsterdam (NL)

( * ) Notice: Subject to any disclaimer, the term of this patent is extended or adjusted under 35 U.S.C. 154(b) by 401 days.

(21) Appl. No.: 13/394,473

(22) PCT Filed: Sep. 1, 2010

(86) PCT No.: PCT/EP2010/062785
§ 371 (c)(1),
(2), (4) Date: May 9, 2012

(87) PCT Pub. No.: WO2011/029757
PCT Pub. Date: Mar. 17, 2011

(65) Prior Publication Data
US 2012/0286902 A1 Nov. 15, 2012

(30) Foreign Application Priority Data
Sep. 11, 2009 (DE) .......................... 10 2009 041 359

(51) Int. Cl.
| | | |
|---|---|---|
| H05K 1/16 | (2006.01) | |
| H05K 3/30 | (2006.01) | |
| G06K 19/077 | (2006.01) | |
| H01Q 7/00 | (2006.01) | |
| H01Q 9/27 | (2006.01) | |
| H05K 3/10 | (2006.01) | |
| H01L 23/00 | (2006.01) | |
| H01F 41/06 | (2006.01) | |

(52) U.S. Cl.
CPC .................. *H05K 1/162* (2013.01); *H05K 3/30* (2013.01); *Y10T 156/10* (2013.01); *Y10T 156/17* (2013.01); *G06K 19/07749* (2013.01); *G06K 19/07779* (2013.01); *H01F 41/0658* (2013.01); *H01Q 7/00* (2013.01); *H01Q 9/27* (2013.01); *H05K 3/103* (2013.01); *H05K 2201/09245* (2013.01); *H05K 2201/09672* (2013.01); *H05K 2201/1028* (2013.01); *H01L 24/85* (2013.01); *H01L 2924/0002* (2013.01)

(58) Field of Classification Search
CPC ............ H05K 1/162; H05K 3/30; H05K 3/32
See application file for complete search history.

(56) References Cited

U.S. PATENT DOCUMENTS

| | | | |
|---|---|---|---|
| 6,665,931 B2 | 12/2003 | Yamaguchi et al. | |
| 2003/0052767 A1 | 3/2003 | Yamanobe et al. | |
| 2004/0231885 A1* | 11/2004 | Borland et al. | ............... 174/260 |
| 2007/0109720 A1* | 5/2007 | Kamei | ....................... 361/321.2 |
| 2008/0179404 A1 | 7/2008 | Finn | |
| 2010/0230151 A1 | 9/2010 | Michalk | |

FOREIGN PATENT DOCUMENTS

| | | |
|---|---|---|
| DE | 198 40 220 A1 | 4/2000 |
| DE | 10347035 | 5/2005 |
| DE | 10 2006 053 823 | 5/2008 |
| DE | 10 2007 027 539 | 12/2008 |
| DE | 10 2009 012 255 | 9/2010 |
| JP | 2003085516 | 3/2003 |
| JP | 2003304047 | 10/2003 |
| WO | 2006/079913 | 8/2006 |

OTHER PUBLICATIONS

The International Preliminary Report on Patentability as mailed on Mar. 22, 2012 for International Application No. PCT/EP2010/062785.
The International Search Report as mailed on Dec. 17, 2010 for International Application No. PCT/EP2010/062785.

* cited by examiner

*Primary Examiner* — Jeremy C Norris
(74) *Attorney, Agent, or Firm* — Quarles & Brady LLP

(57) ABSTRACT

The present invention relates to a circuit arrangement (1) having a prescribed electrical capacitance, comprising a substrate (S) having at least one metallic, electrically conductive conductor (L, Lb, Ls). According to the invention, at least one first conductor strip segment (LA1) is disposed on the substrate (S) and at least some regions of at least one second conductor strip segment (LA2, LA3, LA4) are disposed on the first conductor strip segment (LA1), wherein an electrically insulating layer (iS) is disposed between the conductor strip segments (LA1, LA2, LA3, LA4), forming a dielectric. The invention further relates to a method and a device (2) for producing a circuit arrangement (1) having a prescribed electrical capacitance.

16 Claims, 9 Drawing Sheets

Figure 1A:
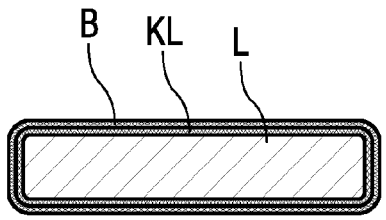

CIRCUIT CONFIGURATION HAVING A PRESCRIBED CAPACITANCE, AND METHOD AND DEVICE FOR THE PRODUCTION THEREOF

CROSS-REFERENCE TO RELATED APPLICATIONS

This application represents the national stage entry of PCT International Application No. PCT/EP2010/062785 filed on Sep. 1, 2010 and claims the benefit of German Patent Application No. DE 10 2009 041 359.6 filed Sep. 11, 2009. The contents of both of these applications are hereby incorporated by reference as if set forth in their entirety herein.

The present invention relates to a method for producing a circuit arrangement having a prescribed electrical capacitance according to the features of the preamble of claim 1, a circuit arrangement having a prescribed electrical capacitance according to the features of the preamble of claim 11 and a device for producing a circuit arrangement having a prescribed electrical capacitance according to the features of the preamble of claim 13.

From the state of the art, as described in document WO 2006/079913 A1, a device and a method are known for producing an antenna for a high-frequency identification unit. A device for producing an antenna for wire transponders made of an electrically conductive material comprises laying means for laying a wire on a substrate which is placed on retaining means. The laying means and the substrate can be moved relative to each other. The retaining means can be moved in parallel to at least two axes of a Cartesian coordinate system.

In the method for producing an antenna, a layer being wound up on at least one reel or a wire of an electrically conductive material being wound up on said reel is unwound from the reel or is pressed onto a surface of the substrate using pressing means, is fixed and separated from the not yet applied layer or the wire by separating means, wherein the substrate can be moved along at least one direction essentially in parallel to an axis of a Cartesian coordinate system with respect to the device comprising the at least one reel, the pressing means and the separating means.

In the as yet unpublished application DE 10 2009 012 255.9-33 of the applicant, which is incorporated herein by reference, a circuit arrangement is described. Said circuit arrangement comprises a substrate having at least one electronic component. At least one metallic, electrically conductive conductor strip is disposed in a circuit pattern on top of and/or in the substrate, wherein terminals of the electronic component are electrically connected to contact regions of the conductor strip.

Moreover, this document discloses a method for producing a circuit arrangement on a substrate. In this context, at least one conductor strip is applied onto at least one surface side of the substrate, which is coated with a meltable insulating lacquer on a surface side facing toward the substrate, wherein the insulating lacquer is heated with the aid of thermal energy or with the aid of ultrasound and is at least partially melted, and the conductor strip is pressed onto the substrate.

Moreover, this document discloses a device for producing a circuit pattern on a substrate. The device comprises a conductor strip coil and a cylindrical or conical laying tool, which at least over a part of its length has an interior bore which guides the conductor strip, and has an annular active area which merges in inner and outer radius and which is arranged perpendicular to a longitudinal axis thereof.

Document US 2008/0179404 A1 discloses a method and devices for producing transponder security cards. In this process, a transponder chip module is inserted into a gap in a substrate. End sections of an antenna wire are held in position on terminal areas of the chip module with the aid of an adhesive. The adhesive is transparent in order to enable connection of the antenna wire with the terminal areas using laser radiation with the aid of an electrically conductive adhesive or solder material. The transponder security card has a cover on top of the chip module and the antenna. The gap for the chip module and a duct for the antenna wire are formed on the substrate by the removal of substrate material using laser.

Document DE 10 2007 027 539 A1 describes a transponder system. Said transponder system has a transponder which is inserted into a metallic housing, for instance a clock, and which, in addition to the transponder chip and the antenna coil, has a capacitor being connected in parallel to the coil for setting a prescribed resonance frequency. In said transponder, only a part of the capacitor is formed on the transponder element. The other part, i.e. the respective counter-electrode of the corresponding capacitor, is formed by a metallic surface of the metallic housing carrying the transponder element.

Document DE 10 2006 053 823 A1 discloses a method for laying a wire on a substrate in a transition zone between a first section and a second section, in particular for producing an antenna for a transponder unit. Moreover, this document discloses a laying device and a wire arrangement. In the transition zone, the wire is laid between the end of the first section and the beginning of the second section along a bent curve with a concave curvature, as viewed from a connection line between the end of the first section and the beginning of the second section, in such a manner that starting from the end of the first section, firstly the wire is removed from a storage unit for the wire. Here, the end of the wire is moved into a direction which encloses an angle of a size preferably smaller than 180° jointly with a connection line. The arm of the angle of the removal direction here is located on the side of the connection line, where the bent curve is disposed as well. During movement of the wire end, the wire is not connected with the substrate. The wire is removed with a length being larger than or equal to the length of the connection line. The end of the removed wire is subsequently connected with the substrate at the beginning of the second section.

Document DE 103 47 035 A1 describes an electronic data carrier. Electrically conductive structures are fixed on a substrate which is transparent for laser radiation in a laser radiation method. On the side of the substrate opposite to the laser radiation source, an electrically conductive complex is supplied and is contacted with the substrate surface. The electrically conductive complex can be a transfer material having an electrically conductive coating, from which the conductor structures are separated, or can be a thermoplastically coated wire or string, which is completely fixed on the substrate surface, or can be an electrically conductive paste.

Document DE 198 40 220 A1 discloses a transponder module and a method for producing the same. The transponder module, in particular for an electronic label, comprises a layer being composed of an insulating material, which is provided as the single carrier substrate. An antenna device is formed on a first main surface of the carrier substrate. A non-encapsulated circuit chip is disposed in a recess of the carrier substrate such that a first main surface of the circuit chip lies essentially flush with the first main surface of the first carrier substrate. Between the circuit chip and the antenna device provision is made for electrical connection devices.

Document U.S. Pat. No. 6,665,931 B2 describes a method for laying conductor wire on a substrate. In this process, the conductor wire is placed onto the substrate by means of a three-dimensional relative movement between the substrate and a wire laying tool and is punctually fixed at the substrate by a periodic approximation between the wire laying tool and the substrate.

The invention is based on the idea of providing an improved method for producing a circuit arrangement having a prescribed electrical capacitance, a circuit arrangement having a prescribed electrical capacitance produced with the aid of said method and a device for producing the circuit arrangement and for performing the method.

This object is attained according to the invention by means of a method for producing a circuit arrangement having a prescribed electrical capacitance with the features of claim 1, a circuit arrangement having a prescribed electrical capacitance with the features of claim 11 and a device for producing a circuit arrangement having a prescribed electrical capacitance with the features of claim 13.

Advantageous embodiments of the invention are the subject-matter of the dependent claims.

A circuit arrangement having a prescribed electrical capacitance comprises a substrate having at least one metallic, electrically conductive conductor strip.

At least one first conductor strip segment is disposed on the substrate and at least one second conductor strip segment is at least partially disposed on the first conductor strip segment, wherein an electrically insulating layer is disposed between the conductor strip segments, forming a dielectric.

According to the invention, the conductor strip has a width of 100 µm to 1000 µm and a thickness of 5 µm to 40 µm, preferably a thickness of 10 µm to 40 µm, and the conductor strip segments are partially placed on top of each other selectively and in a defined manner or are almost completely placed on top of each other and are integrally joined to each other.

The conductor strip segments can be part of a conductor strip or a plurality of conductor strips, wherein two or more conductor strip segments can be disposed partially or completely on top of each other. The circuit arrangement can have a plurality of said conductor strip segments which are disposed on top of each other so as to be arranged side by side.

As a result, electrical capacitors can be produced in a simple and cost-efficient manner by laying conductor strips on top of each other selectively and in a defined manner either partially or almost completely, which on the one hand strongly modify coil-shaped conductor strip circuits in their capacity as parasitic capacitors and on the other hand for instance can serve as coupling capacitors in a complex circuit, whereby circuit elements can be capacitively coupled. Moreover, circuit arrangements having prescribed impedances can be produced.

In this way, for instance circuit arrangements having resonance coils can be produced, wherein an increase in the electrical capacitance makes it possible to reduce an inductance of the coil. This allows smaller coil surfaces, an enhanced layout dimensioning of the circuit arrangement and a smaller number of windings of the coil. This results in an increased efficiency.

Due to a shorter conductor strip length as a result of the smaller number of windings, the coil has a lower internal resistance, which results in an improved coil quality.

For instance circuit arrangements having coils with a resonance frequency of 13.56 MHz for so-called dual interface cards can be produced in a simple and cost-efficient manner. Said dual interface cards enable a data transmission both via direct contacting and radio transmission. In addition, for instance circuit arrangements having low-frequency coils can equally be produced.

The substrate for instance is paper, synthetic paper, thermoplastic foil or wood. The substrate can have a flat and even surface or a spherical surface. Moreover, the substrate can also be metal, for instance also an already laid conductor strip. The substrate for instance can also be a conductor plate or a conductor foil, for instance with printed, etched, laser-cut or milled conductor strips or conductor surfaces, which can form the lower conductor strip that is directly disposed on the substrate and on which additional conductor strip segments are at least partially disposed. Said conductor plates or conductor foils for instance can also have an insulating or adhesive coating. The substrate can also be formed of textile materials.

The material of the conductor strip is preferably copper or copper bronze, preferably in a soft material state, and, where required, for instance can have a coating of silver or solder paste.

In an advantageous embodiment, the electrically insulating layer is formed of a meltable baked lacquer or adhesive, wherein the adhesive is thermoplastic, thermally reactive, UV-reactive and/or pressure reactive. In another advantageous embodiment, the electrically insulating layer is formed of a core lacquer and a meltable baked lacquer which is disposed thereon, wherein a softening temperature of the core lacquer is significantly higher than a softening temperature of the baked lacquer, or the electrically insulating layer is formed of a core lacquer disposed on a surface of the conductor strip and an adhesive disposed thereon, wherein the adhesive is thermoplastic, thermally reactive, UV-reactive and/or pressure reactive. The baked lacquer and/or the thermoplastic adhesive preferably has a softening temperature of 110° C. to 200° C.

Advantageously, due to the softening of the baked lacquer or the adhesive and subsequent curing, the conductor strip segments can be integrally joined to each other and to the substrate. A thickness of the baked lacquer and/or the adhesive preferably is between 1 µm and 5 µm. A thickness of the core lacquer, which is not softened during laying of the conductor strip segments for the purpose of forming the electrical capacitance, preferably is between 2 µm and 4 µm. The adhesive or the baked lacquer, where required, together with the core lacquer forms the insulating layer between the conductor strip segments and thus the dielectric which has a prescribed thickness.

In an advantageous embodiment, the conductor strip segments are disposed on the substrate so as to be raised, for instance by removal of the substrate material next to the conductor strip segments. In this way, for instance a circuit arrangement having a compact self-supporting coil can be produced.

In a preferred embodiment, the conductor strip segments form a coil having at least two windings or a plurality of windings. In this context, individual winding or all windings of the coil can be disposed on top of each other only partially, almost completely or else completely, and can be fixed on top of each other.

In a particularly preferred embodiment, the conductor strip segments of the coil, which are insulated against each other and which are placed on top of each other, form a resonant circuit having the prescribed electrical capacitance, a prescribed inductance and a prescribed resonance frequency.

In a method for producing a circuit arrangement having a prescribed electrical capacitance, wherein at least one metallic, electrically insulating conductor strip is laid on at least one surface side of a substrate, at least one first conductor strip segment is laid on the substrate and at least one second conductor strip segment is at least partially laid on the first conductor strip segment, wherein an electrically insulating layer is disposed between the conductor strip segments, forming a dielectric.

According to the invention, a conductor strip having a width of 100 μm to 1000 μm and a thickness of 5 μm to 40 μm, preferably a thickness of 10 μm to 40μ, is laid, wherein the conductor strip segments are partially placed on top of each other selectively and in a defined manner or are almost completely placed on top of each other and are integrally joined to each other.

The conductor strip segments can be part of a conductor strip or a plurality of conductor strips, wherein two or more conductor strip segments can be partially or completely disposed on top of each other. By means of the method, a circuit arrangement having a plurality of said conductor strip segments, which are disposed on top of each other, can also be produced so that the same are arranged side by side. The conductor strip segments for instance can cross each other at different angles.

By means of the method for instance circuit arrangements having one coil or having several coils, which have at least two windings or a plurality of windings, can equally be produced. Here, individual windings or all windings of the coil for instance can be placed on top of each other only partially, almost completely or else completely, and can be fixed on top of each other.

By means of this measure, electrical capacitors can be produced in a simple and cost-efficient manner by laying conductor strips on top of each other selectively and in a defined manner either partially or almost completely, which on the one hand strongly modify coil-shaped conductor strip circuits in their capacity as parasitic capacitors, and on the other hand for instance can serve as coupling capacitors in a more complex circuit, whereby circuit elements are capacitively coupled. Moreover, circuit arrangements having prescribed impedances can be produced.

By means of the method for instance circuit arrangements having resonance coil can be produced, wherein an increase in the electric capacitance makes it possible to lower an inductance of the coil. This permits smaller coil surfaces, an enhanced layout dimensioning of the circuit arrangement and a smaller number of windings of the coil. This results in a higher efficiency.

Due to a shorter conductor strip length as a result of the smaller number of windings, coils having a lower internal resistance can be produced, resulting in an improved coil quality.

By means of the method for instance circuit arrangements having coils with a resonance frequency of 13.56 MHz for so-called dual interface cards can be produced in a simple and cost-efficient manner. Said dual interface cards enable a data transmission both via direct contacting and radio transmission. Moreover, for instance circuit arrangements having low-frequency coils can equally be produced.

The substrate used in the method for instance is paper, synthetic paper, thermoplastic foil or wood, having a flat and even surface or a spherical surface. Moreover, the substrate can also be metal, for instance an already laid conductor strip. The substrate for instance can also be a conductor plate or a conductor foil, for instance having printed, etched, laser-cut or milled conductor paths or conductor surfaces, which form the lower conductor strip, which is firstly and directly laid on the substrate and on which additional conductor strip segments are at least partially laid. Said conductor plates or conductor foils for instance can also have an insulating or adhesive coating. Moreover, the substrate can be formed of textile materials.

In said method, conductor strips preferably being made of copper or copper bronze in a soft material state are particularly suitable for the laying. The used conductor strip, where required, for instance can have a coating of silver or solder paste.

It is expedient to place the electrically insulating layer on at least one surface side of at least one conductor strip segment and/or on a region of the substrate to be coated with the second conductor strip segment prior to the laying of the conductor strip. In an advantageous embodiment, meltable baked lacquer or an adhesive are applied onto a surface of the conductor strip as an electrically insulating layer, wherein the adhesive is thermoplastic, thermally reactive, UV-reactive and/or pressure reactive. In another advantageous embodiment, the electrically insulating layer is formed by the application of a core lacquer and a meltable baked lacquer onto a surface of the conductor strip, wherein a softening temperature of the core lacquer is significantly higher than a softening temperature of the baked lacquer, or the electrically insulating layer is formed by the application of a core lacquer or an adhesive onto a surface of the conductor strip, wherein the adhesive is thermoplastic, thermally reactive, UV-reactive and/or pressure reactive.

If core lacquer and/or baked lacquer are used, they are preferably not applied onto the surface directly before laying of the conductor strip. Even if adhesive is used as an insulating layer, it is not required to be applied onto the surface directly before laying of the conductor strip. In particular when UV-reactive and/or pressure reactive adhesive is used, this is not necessarily required, since it is reaction-excited only by UV-radiation, respectively by pressure application. Thermoplastic and/or thermally reactive adhesive under certain circumstances needs to be cooled until the conductor strip is laid, i.e. the conductor strip needs to be stored in a cool environment until it is used. Furthermore, the adhesive can also be used in combination with the core lacquer which does not melt at all or which melts only at very high temperatures, i.e. the core lacquer is applied onto the conductor strip and adhesive is used instead of the baked lacquer.

In another embodiment, the adhesive can also be applied onto the conductor strip only directly before laying of the conductor strip, advantageously in liquid form. In this way, the application of the adhesive onto the conductor strip can be controlled as a function of the respective requirements, so that the adhesive can be applied in a varying thickness and cannot be applied onto the whole conductor strip, but can only be partially applied, whereby material and cost reductions can be realized and a thickness of the insulating layer, forming the dielectric, can be optimally adapted to the respective requirements in order to reach the prescribed electrical capacitance.

Preferably, the electrically insulating layer is heated directly before laying and/or during laying of the second conductor strip segment on the first conductor strip segment with the aid of thermal energy, ultrasound, UV radiation and/or pressure, is at least partially melted and/or reaction-excited. Hence, the conductor strip segments can be integrally and firmly joined to each other or to the substrate. Prior to this process, the baked lacquer or the adhesive are inactive, so that the conductor strip can be transported for instance in wound-up format prior to the laying, and during laying can be unwound from a conductor strip coil without the risk of sticking.

It is pertinent to press the second conductor strip segment onto the first conductor strip segment with a prescribed force, in order to in this way adjust a thickness of the insulating layer being sandwiched therebetween and to firmly join the conductor strip segments to each other. By means of adjusting the thickness of the insulating layer, which forms the dielectric, the prescribed electrical capacitance can be set.

In a preferred embodiment, a laid conductor strip region is cooled directly after laying. Hence, the conductor strip segments can be integrally and firmly joined to each other directly after laying, so that the conductor strip can be laid on the substrate rapidly and in a plurality of patterns, without the risk of already laid conductor strip segments slipping out of place again. As a result, the conductor strip can be laid with high precision, whereby the prescribed electrical capacitance of the circuit arrangement can be set with high accuracy, i.e. with very small tolerances.

Preferably, the conductor strip is laid with the aid of a laying tool, wherein the laying tool is moved relative to the substrate and/or the substrate is moved relative to the laying tool. As a consequence, a very rapid and highly accurate laying of the conductor strip is enabled. The laying of the conductor strip in this way can be performed in the x-direction and y-direction on a two-dimensional substrate and on a three-dimensional, for instance curved or inclined substrate also in the z-direction of a Cartesian coordinate system.

It is essential for the laying of conductor strips that the conductor strip is supplied to the laying tool without twisting.

In an advantageous embodiment, the conductor strip is laid with the aid of an ultrasonic laying tool, wherein the ultrasound is preferably directed perpendicular to a surface of the substrate. Using the ultrasonic laying tool, the conductor strip, respectively the baked lacquer or the adhesive, can be heated and the conductor strip segments can be pressed against each other and onto the substrate, so that the conductor strip segments can be integrally and firmly joined to each other and/or to the substrate, wherein the thickness of the insulating layer can be adjusted between the conductor strips according to the requirements in order to reach the prescribed electrical capacitance.

In another advantageous embodiment, the conductor strip is heated and laid with the aid of a heated pressure roller as a laying tool, so that the baked lacquer, respectively the adhesive, is also heated with the aid of the pressure roller and the conductor strip segments are pressed against each other or against the substrate. By means of this measure, the conductor strip segments can be integrally and firmly joined to each other or to the substrate, wherein the thickness of the insulating layer between the conductor strips can be adjusted according to the requirements in order to reach the prescribed electrical capacitance.

In order to ensure optimum heating of the conductor strip, respectively the baked lacquer or the adhesive, the conductor strip is preferably guided along half the circumference of the pressure roller prior to the laying.

In one embodiment of the method, a substrate material is at least partially removed in the region of the conductor strip subsequent to the laying of the conductor strip, in order to thereby for instance create a compact, self-supporting coil on the substrate.

In an advantageous embodiment, the conductor strip segments are laid on top of each other such that they form a coil having at least two windings, wherein the conductor strip segments of the coil, which are insulated against each other and which are placed on top of each other, form a resonant circuit having a prescribed electrical capacitance, a prescribed inductance and a prescribed resonance frequency.

In a particularly advantageous embodiment of the method, the electrical capacitance is determined during laying and/or subsequent to laying, so that the prescribed electrical capacitance is reliably reached and is ensured in a completed circuit arrangement. Particularly advantageously, the electrical capacitance is constantly monitored during laying.

Particularly preferably, the laying parameters are prescribed prior to the laying as a function of the prescribed electrical capacitance to be reached and/or are controlled and/or adjusted during laying as a function of the prescribed electrical capacitance to be reached.

Preferably a laying direction, a laying speed, a length of the laid conductor strip, a duration and/or an intensity of the UV radiation, a duration and/or a level of the heating temperature of the heating with the aid of thermal energy and/or with the aid of ultrasound and/or a duration and/or a level of the pressure are prescribed, controlled and/or adjusted as laying parameters. In this way, the laying of the conductor strip segments can be adapted in such a manner that the prescribed electrical capacitance of the circuit arrangement is reached.

In particular during monitoring of the electrical capacitance during laying of the conductor strip and a controlling and/or adjusting of the laying parameters resulting therefrom, it is possible to immediately adjust the laying of the conductor strip segments and to complete it when the prescribed electrical capacitance is reached.

A very simple possibility to exactly reach the prescribed electrical capacitance consists in laying several conductor strip segments crossing each other, wherein, due to a change of an angle at which the conductor strip segments cross each other, a surface overlap of the conductor strips, and thus a size of the capacitor electrode surfaces, which are formed by the conductor strip segments, is variable.

In this way, preferably a change of the laying direction and/or the laying length of the conductor strip causes a change of a number and/or a surface extension of regions where the conductor strip segments are laid on top of each other.

In another advantageous embodiment, the conductor strip is laid in such a manner that the prescribed electrical capacitance is undershot within a prescribed tolerance range, and by subsequently performing a heating process with the aid of thermal energy and/or ultrasound and pressure application onto at least one of the regions where at least two conductor strip segments are laid on top of each other, a thickness of the electrically insulating layer between the conductor strip segments is reduced to the extent that the prescribed electrical capacitance is reached by at least partially melting and squeezing out the baked lacquer or the adhesive between the conductor strip segments. By means of squeezing out the baked lacquer and/or the adhesive, for instance using a heated or an ultrasonic-assisted plunger, the electrically insulating layer between the conductor strip segments and thus the dielectric is reduced. By means of this embodiment, the prescribed electrical capacitance can be produced with a high accuracy and with only very small tolerances.

Another possibility to realize this aspect is provided by another advantageous embodiment of the method, wherein the conductor strip is laid in such a manner that the prescribed electrical capacitance is undershot within a prescribed tolerance range and a subsequent pressure application onto at least one of the regions where at least two conductor strip segments are laid on top of each other causes a surface extension of said region to be enlarged by widening of the conductor strip segments to the extent that the prescribed capacitance is reached. The enlargement of the conductor strip segments, which are placed on top of each other for instance by means of an unheated plunger, causes capacitor surfaces and thereby the electrical capacitance to become larger. In this embodiment, a repeated heating of the conductor strip is not required.

In another advantageous embodiment, the conductor strip is laid such that the prescribed electrical capacitance is overshot within a prescribed tolerance range, and a plurality of conductor strip segments, which are placed on top of each other, are formed side by side on the substrate, and subsequently a prescribed number of the conductor strip segments, which are placed on top of each other, are separated from the circuit arrangement by cutting the conductor strip, so that the prescribed electrical capacitance is reached. For instance, several conductor strip segments crossing each other are laid, and subsequently some of said crossings are separated from the circuit arrangement by separating the conductor strip in order to thereby reach the prescribed electrical capacitance.

A device for producing a circuit arrangement having a prescribed electrical capacitance comprises a laying tool, a conductor strip coil and substrate positioning means, wherein at least one first conductor strip segment can be laid on the substrate and at least one second conductor strip segment can be at least partially laid on the first conductor strip segment, such that an electrically insulating layer is disposed between the conductor strips segments, forming a dielectric.

According to the invention, a metallic, electrically conductive conductor strip having a width of 100 µm to 1000 µm and a thickness of 5 µm to 40 µm, preferably having a thickness of 10 µm to 40 µm, can be laid, wherein the conductor strip segments can be partially laid on top of each other selectively and in a defined manner or can be almost completely laid on top of each other and can be integrally joined to each other, and the laying tool, according to the invention, can be moved relative to the substrate and/or the substrate can be moved relative to the laying tool with the aid of the substrate positioning means, wherein the laying tool always needs to be aligned perpendicular to a respective substrate section to be coated with the conductor strip.

By means of said laying tool, the circuit arrangement having the prescribed electrical capacitance can be produced in a simple and cost-efficient manner very rapidly and with high accuracy, since using the device conductor strip segments can be laid on top of each other, wherein an electrically insulating layer is disposed between said conductor strip segments. As a result, capacitors can be produced which have the conductor strip segments as capacitor electrode surfaces and the insulating layer as a dielectric, wherein the dielectric has a prescribed thickness. By means of prescribing the conductor strip laying structure or by controlling and/or adjusting the laying process, the prescribed electrical capacitance can be reached precisely, since in this way, the number and dimensions of crossing surfaces of the conductor strip segments, which are laid on top of each other, and a dielectric thickness between the respective conductor strip segments, which are laid on top of each other, can be prescribed and can be realized by the laying of the conductor strip segments.

Since the laying tool can be moved relative to the substrate and/or the substrate can be moved relative to the laying tool with the aid of the substrate positioning means, a very rapid and highly accurate laying of the conductor strip is enabled. In this way, the conductor strip can be laid in the x-direction and in the y-direction on a two-dimensional substrate and on a three-dimensional, for instance curved or inclined substrate can be laid also in the z-direction of a Cartesian coordinate system, wherein the laying tool is always aligned perpendicular to a corresponding substrate segment to be coated with a conductor strip.

It is essential for the laying of conductor strips that the conductor strip can be supplied to the laying tool of the device for producing the circuit arrangement without twisting.

In an advantageous embodiment, the laying tool is formed cylindrically or conically and at least over a part of its length has an interior bore, which guides the conductor strip, and has an annular active area, which merges in inner and outer radius and which is arranged perpendicular to the longitudinal axis thereof. Hence, the conductor strip can be passed through the laying tool without twisting and can be optimally laid and fixed on the substrate, respectively on the already laid conductor strip.

Preferably, the laying tool comprises an ultrasonic sonotrode and a converter. The ultrasound preferably is directed perpendicular to a surface of the substrate. Using said laying tool, the conductor strip, respectively a baked lacquer or an adhesive, which forms the electrically insulating layer between conductor strip segments which are disposed on top of each other can be heated, and the conductor strip segments can be pressed against each other and against the substrate, so that the conductor strip segments can be integrally and firmly joined to each other and/or to the substrate, wherein a thickness of the insulating layer can be adjusted between the conductor strip segments according to the requirements, in order to reach the prescribed electrical capacitance.

The conductor strip coil is preferably disposed so as to be rotatably mounted about a horizontal rotational axis in a coil receptacle which is rotatably mounted about a vertical rotational axis, wherein the coil receptacle can be additionally rotated using a tracker device in the case of directional changes during laying of the conductor strip on the substrate, so that the conductor strip can be unwound tangentially from the conductor strip coil without twisting.

In another preferred embodiment, the laying tool is a pressure roller. Said pressure roller is preferably heatable in order to heat the baked lacquer or the adhesive to press the conductor strip segments against each other and/or against the substrate. Thus, the conductor strip segments can be integrally and firmly joined to each other and/or to the substrate, wherein a thickness of the insulating layer can be adjusted between the conductor strips according to the requirements in order to reach the prescribed electrical capacitance.

Preferably, the pressure roller has a guide groove for guiding the conductor strip, the maximum depth of the guide groove corresponding to a thickness of the conductor strip and the minimum width thereof corresponding to at least a width of the conductor strip. By means of this measure, it is ensured that the conductor strip can be optimally guided, so that the conductor strip can be laid on the substrate in different directions and while performing constant directional changes.

Advantageously, the conductor strip coil can be moved together with the laying tool, in order to ensure that the conductor strip can be supplied without twisting and to ensure laying without twisting.

Preferably, a conductor strip guiding device is disposed between the conductor strip coil and the laying tool, which advantageously comprises a resiliently mounted and/or horizontally movable deflection roller. Using said deflection roller, the conductor strip can be deflected preferably in such a manner that it can be guided along at least half the circumference of the pressure roller prior to the laying. If the deflection roller is not resiliently mounted but is horizontally movable, a dimension of a wrapping of the pressure roller can be set prior to the laying of the conductor strip. By means of this measure, optimum heating of the conductor strip, respectively the baked lacquer or the adhesive, can be ensured.

In another preferred embodiment, the conductor strip guiding device has a vertically fixedly mounted deflection roller respectively above and below the resiliently mounted deflection roller, wherein the resiliently mounted deflection roller can be deflected by means of an elastic force by a maximum out of a vertical axis of the two fixedly mounted deflection rollers. As a result, the conductor strip can be supplied to the laying tool optimally, without twisting and in particular so as to be pre-tensioned, so that it can be laid accurately and firmly abuts against the laying tool.

Preferably, the device comprises means for applying an adhesive onto the conductor strip prior to the laying. In this way, the adhesive can be applied in the respectively required thickness, distribution and quality only directly before laying onto the conductor strip on one side and in a thickness-controlled fashion. As a result, the conductor strip can be easily stored and for instance unwound from a conductor strip coil without adhesive, but where necessary already furnished with a core lacquer layer. Sticking of the conductor strip prior to the laying is thus precluded.

In an advantageous embodiment, the device has an UV radiation device for subjecting the conductor strip to UV radiation prior to the laying. In this way, a conductor strip can be processed, which is coated with a UV-reactive adhesive which can be reaction-excited by UV radiation only directly before laying of the conductor strip. In the case of a conductor strip being coated with the UV-reactive adhesive on both sides, the UV radiation device preferably is aligned or can be controlled such that only the UV-reactive adhesive can be reaction-excited on a future lower surface of the conductor strip. The UV-reactive adhesive can also be applied onto the conductor strip well before laying of the conductor strip, without sticking of the conductor strip which is for instance wound up on a conductor strip coil.

Even if adhesive is used as the insulating layer, the adhesive is not required to be applied onto the conductor strip directly before laying of the conductor strip. In particular when UV-reactive and/or pressure-reactive adhesive is used, this measure is not necessarily required, since the same is reaction-excited only by UV radiation, respectively pressure application. Under certain circumstances, it is necessary to cool the thermoplastic and/or thermally reactive adhesive until the conductor strip is laid, i.e. the conductor strip is required to be stored in a cool environment until use is made thereof. Moreover, the adhesive can also be used in combination with the core lacquer which does not melt at all or only at very high temperatures, i.e. the core lacquer is applied onto the conductor strip and the adhesive is used instead of the baked lacquer.

Advantageously, the device comprises a cooling device for the supply of cooled air to the laid conductor strip. As a result, the conductor strip can be cooled directly after laying. In this way, the conductor strip segments are immediately firmly and integrally joined to each other directly after laying, so that the conductor strip can be laid on the substrate very rapidly and in a plurality of patterns, without the risk of already laid conductor strip segments slipping out of place again. As a result, the conductor strip can be laid with high accuracy, whereby the prescribed electrical capacitance of the circuit arrangement can be set with high precision, i.e. with very small tolerances.

Hereinafter, exemplary embodiments of the invention will be described in more detail with reference to the drawings.

Figure 1B:
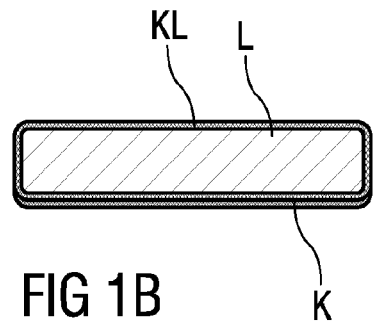
Figure 2:
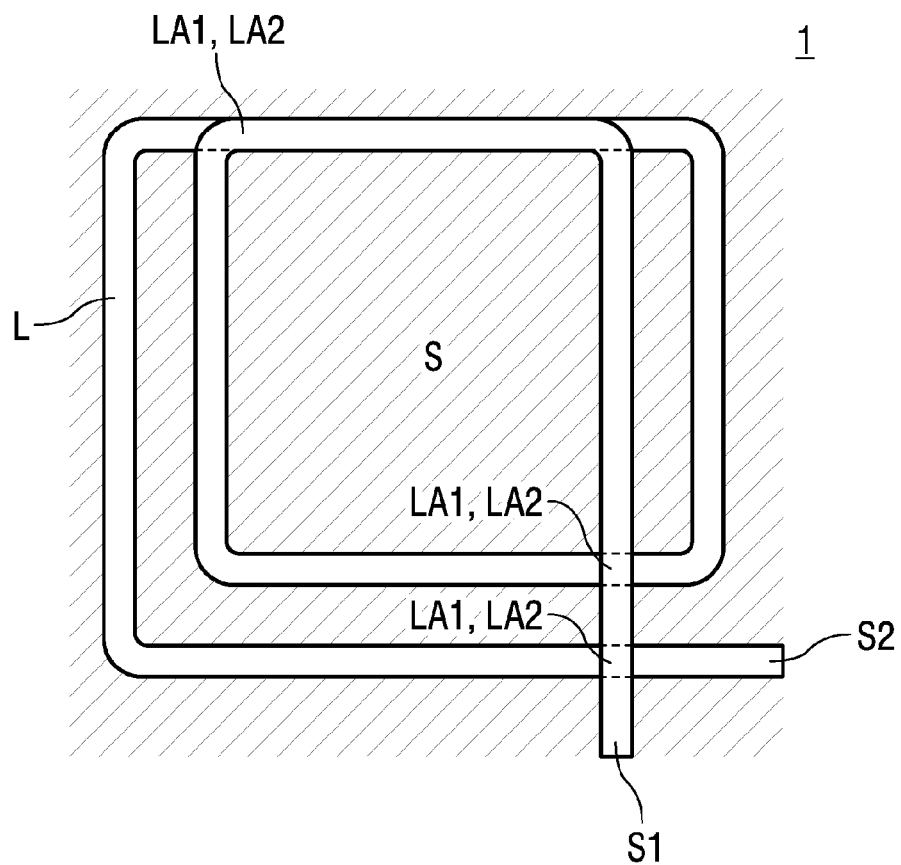
Figure 3A:
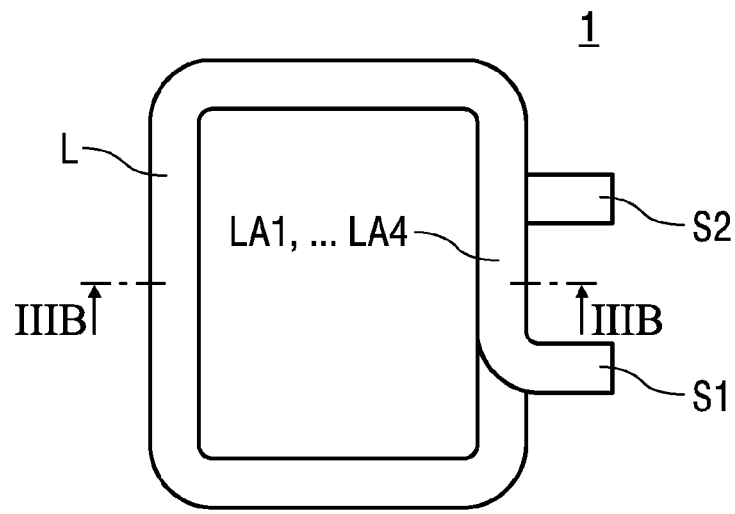
Figure 3B:
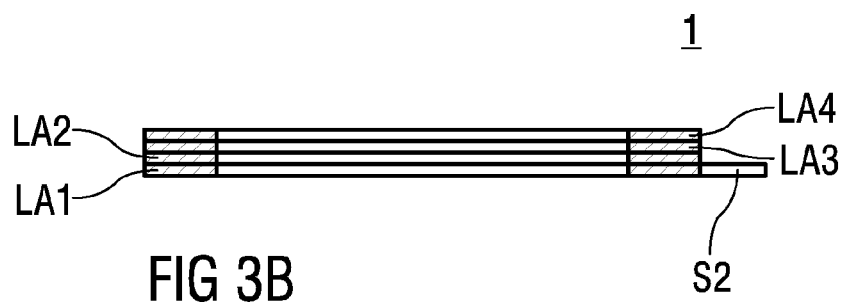
Figure 3C:
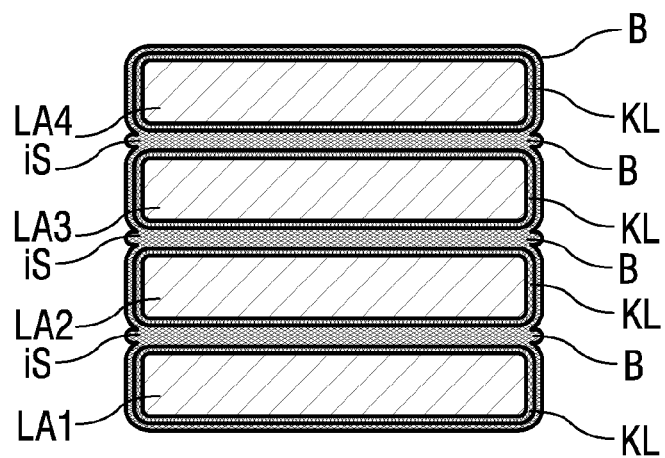
Figure 4:
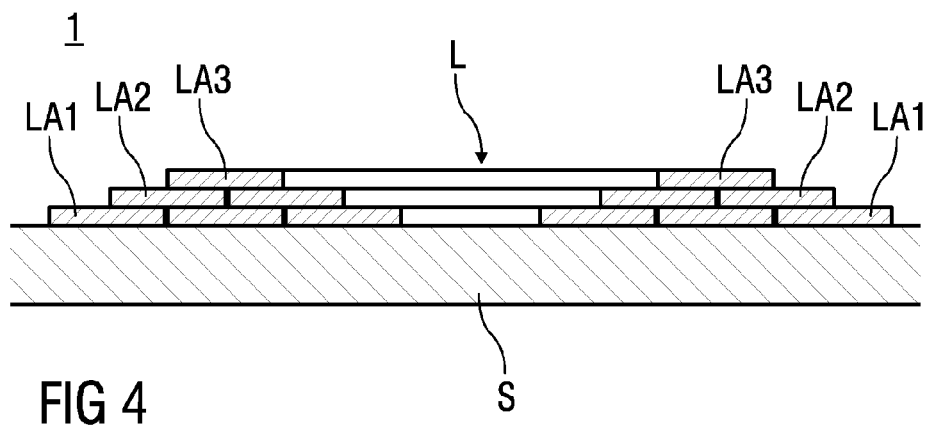
Figures 5A, 5B:
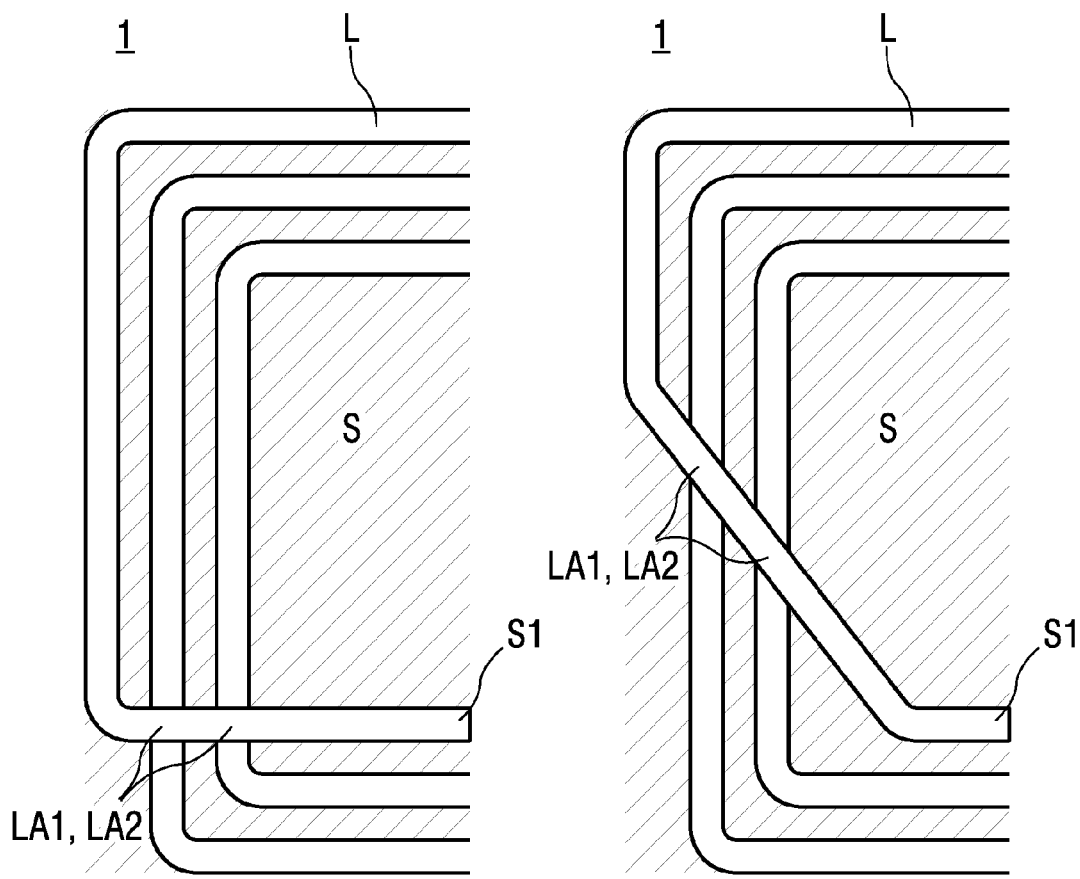
Figure 6:
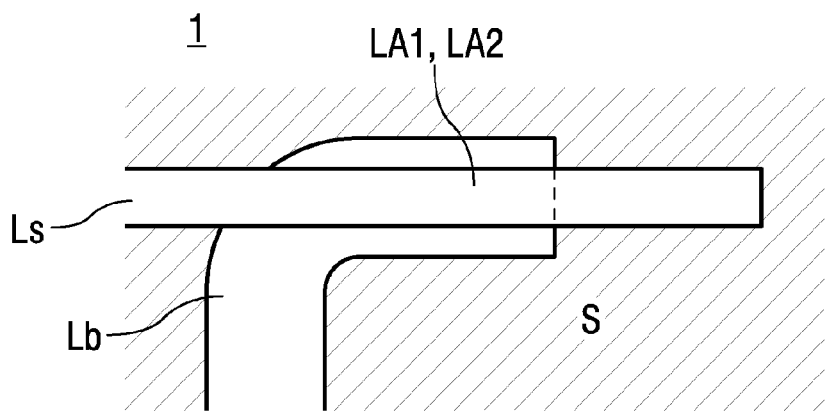
Figure 7A:
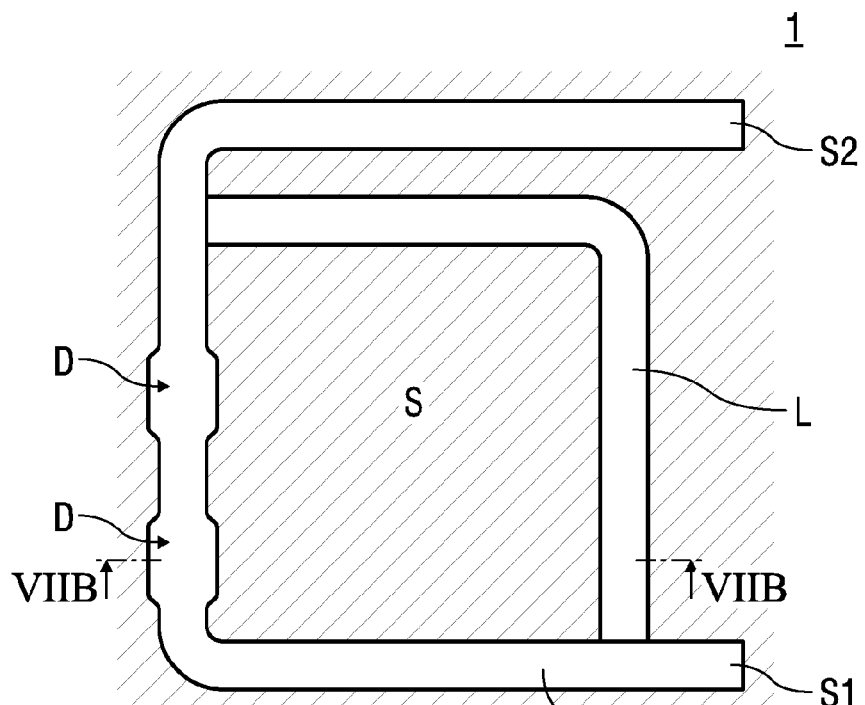
Figure 7B:
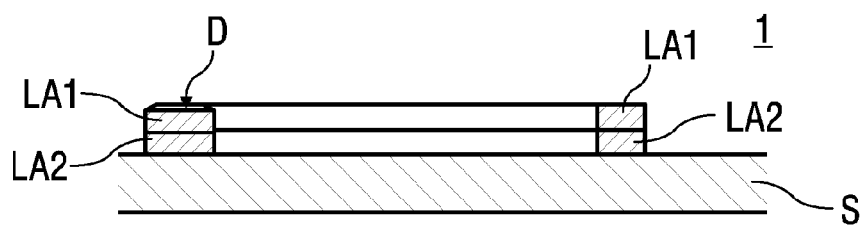
Figure 8A:
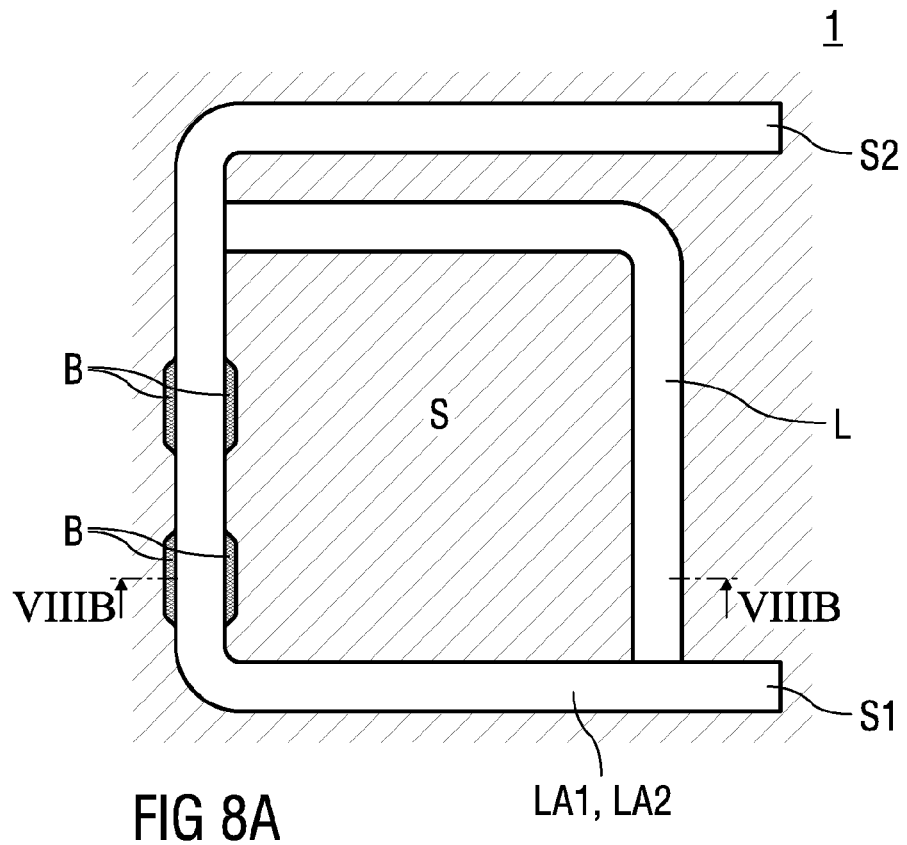
Figure 8B:
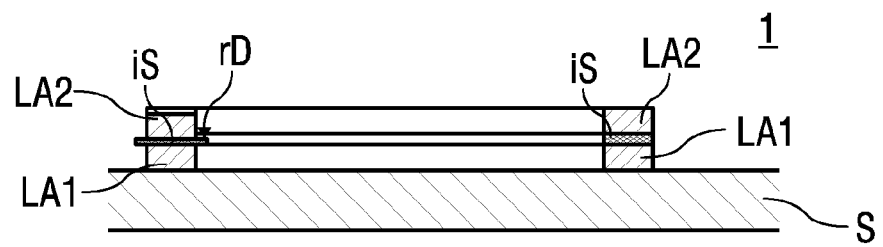
Figure 8C:
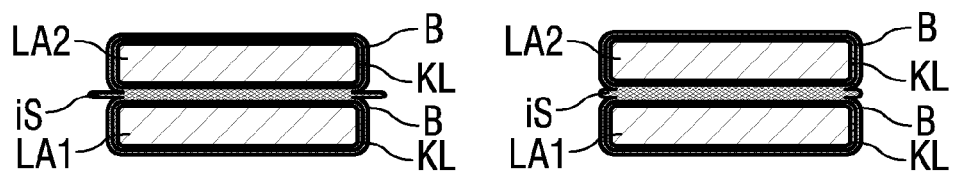
Figure 9:
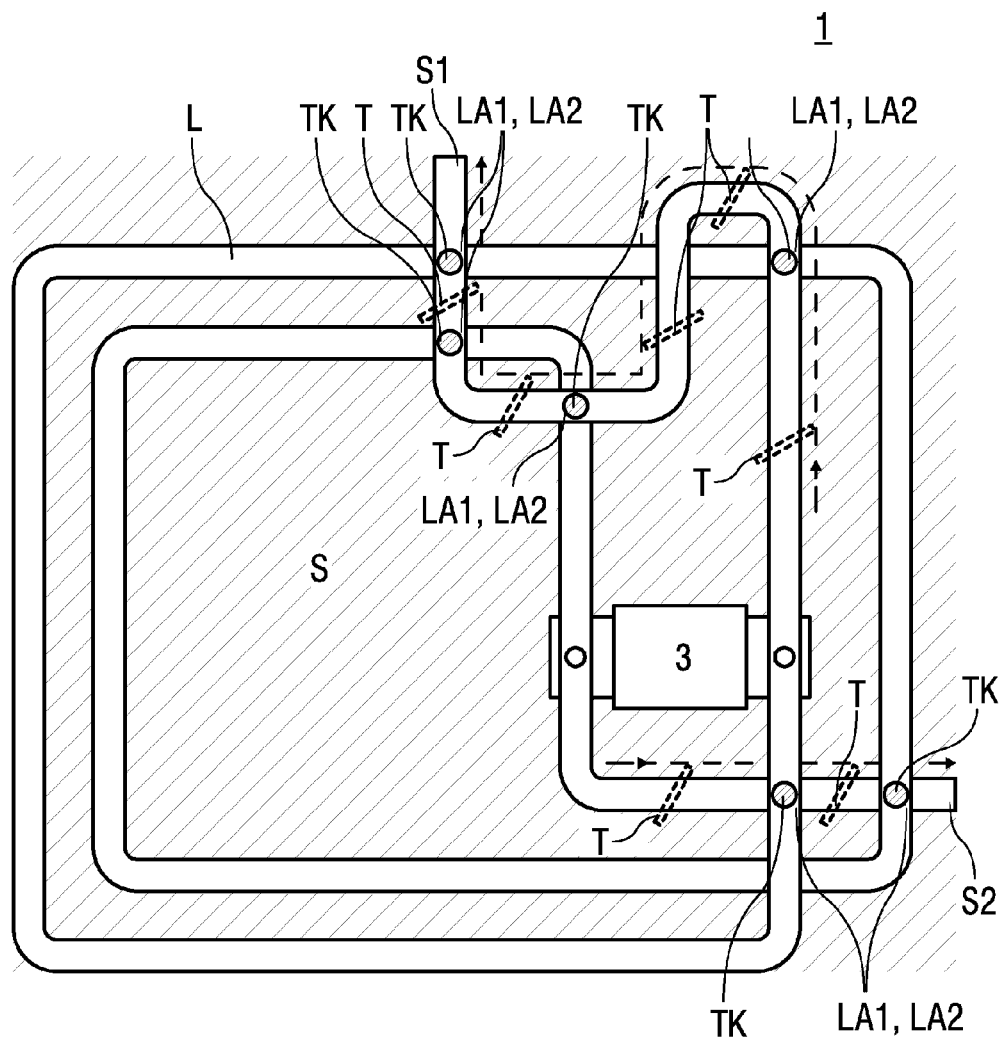
Figure 10A:
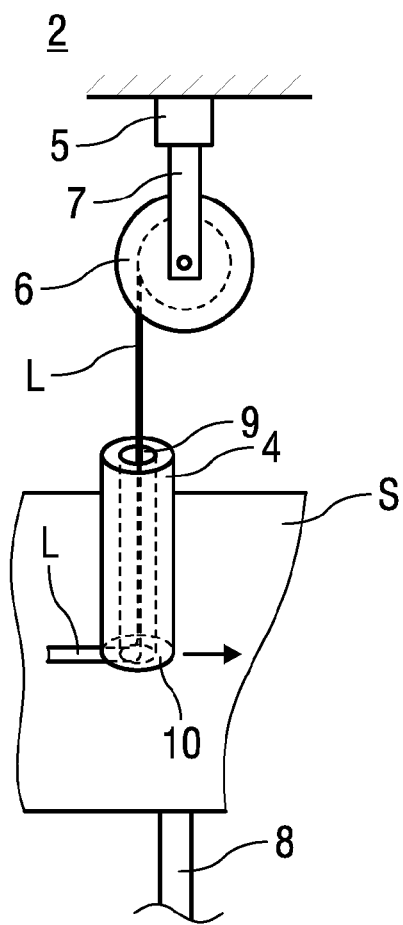
Figure 10B:
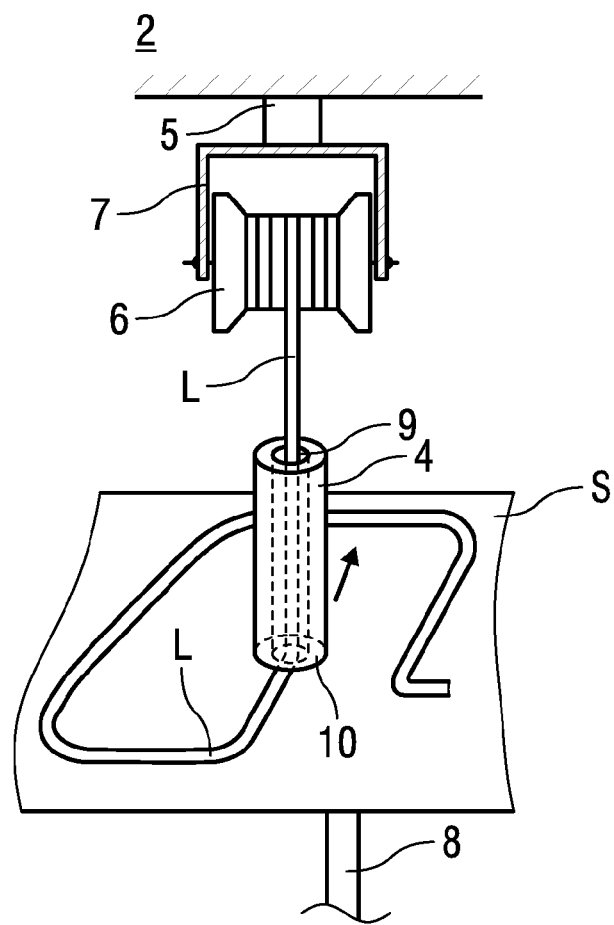
Figure 11:
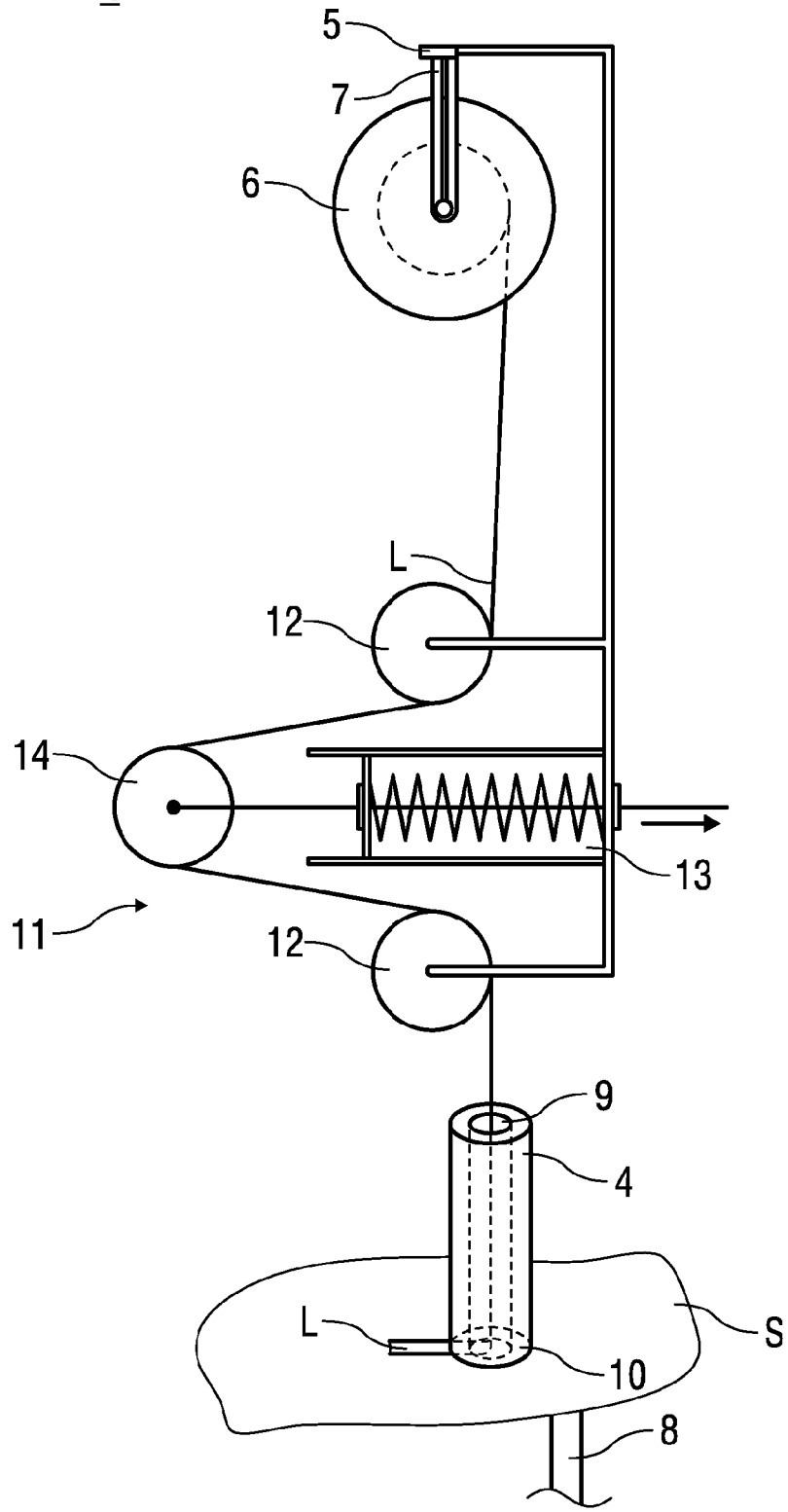
Figure 12:
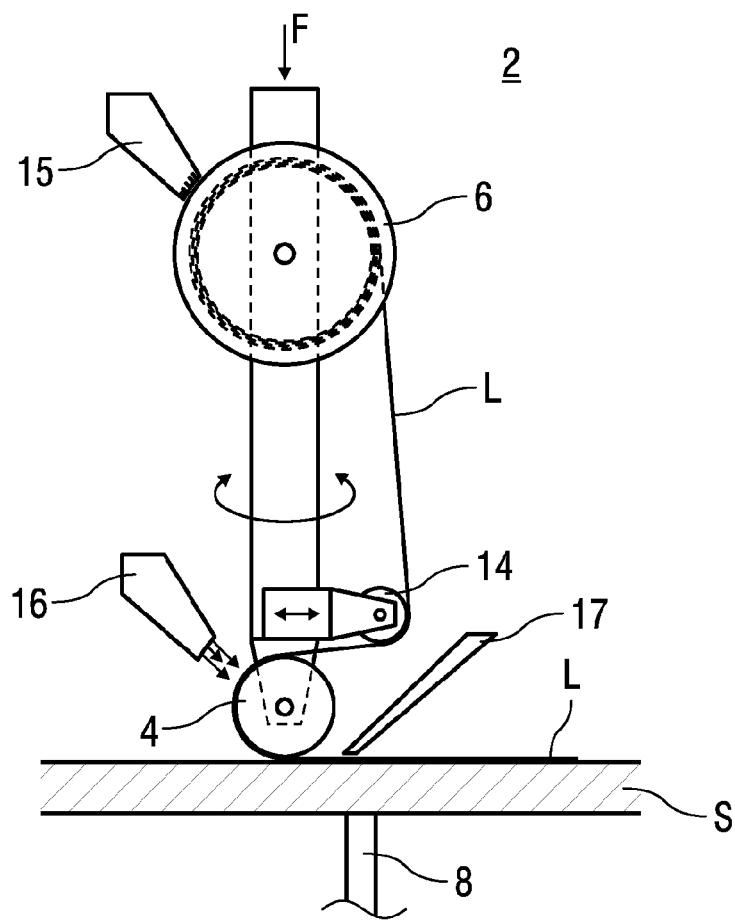
Figure 13:
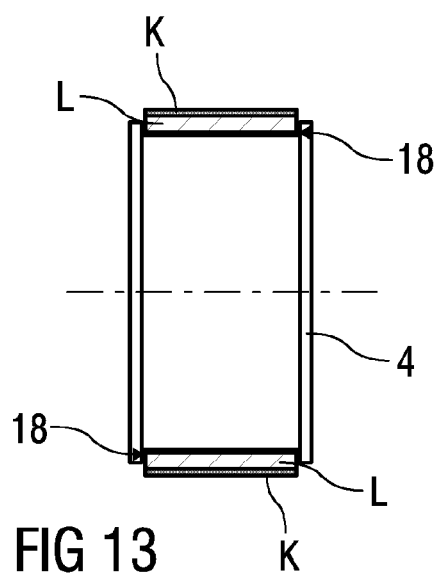

In the drawings:

FIG. 1a shows a first embodiment of a lacquer-insulated conductor strip in a cross-sectional view, FIG. 1b shows a second embodiment of a lacquer-insulated conductor strip in a cross-sectional view, FIG. 2 shows a first embodiment of a laid conductor strip in a top view, FIG. 3a shows a second embodiment of a laid conductor strip in a top view, FIG. 3b shows a cross-sectional view along intersection lines IIIb-IIIb according to FIG. 3a, FIG. 3c shows a detailed view of FIG. 3b, FIG. 4 shows a third embodiment of a laid conductor strip in a cross-sectional view, FIG. 5a shows a fourth embodiment of a laid conductor strip in a top view, FIG. 5b shows a fifth embodiment of a laid conductor strip in a top view, FIG. 6 shows two laid conductor strips in a top view, FIG. 7a shows a sixth embodiment of a laid conductor strip in a top view, FIG. 7b shows a cross-sectional view along intersection lines VIIb-VIIb according to FIG. 7a, FIG. 8a shows a seventh embodiment of a laid conductor strip in a top view, FIG. 8b shows a cross-sectional view along intersection lines VIIIb-VIIIB according to FIG. 8a, FIG. 8c shows a detailed view of FIG. 8b, FIG. 9 shows a circuit arrangement in a top view, FIG. 10a shows a first device for producing a circuit arrangement in a first lateral view, FIG. 10b shows a first device for producing a circuit arrangement in a second lateral view, FIG. 11 shows a second embodiment of a device for producing a circuit arrangement, FIG. 12 shows a third embodiment of a device for producing a circuit arrangement; and FIG. 13 shows a cross-sectional view of a pressure roller.

Equivalent components of all figures are furnished with identical reference numerals.

With reference to the following figures, exemplary embodiments of a circuit arrangement 1 having a prescribed electrical capacitance, illustrated for example in FIG. 2, and a method and a device 2 for the production thereof, illustrated for example in FIG. 10a, will be explained in greater detail.

The circuit arrangement 1 comprises at least one metallic, electrically conductive conductor strip L, illustrated in FIGS. 1a and 1b in a cross-sectional view, which is disposed on a substrate S, illustrated in FIG. 2. The conductor strip L in FIG. 1a on all sides thereof is coated with a core lacquer KL having a thickness of 2 µm and with a baked lacquer B having a thickness of 2 µm being disposed thereon. Instead of the baked lacquer B, as illustrated in FIG. 1b, it is also possible to provide a coating with an adhesive K, for instance with a thermoplastic, thermally reactive, UV-reactive and/or pressure-reactive adhesive K.

In FIG. 1b, the conductor strip L is coated only on one side, in the example illustrated here, with the core lacquer KL having a thickness of 2 µm and with the adhesive K disposed thereon. Instead of the adhesive K, it is also possible here to provide a coating with baked lacquer B, i.e. the baked lacquer B is disposed on the core lacquer KL. The conductor strip L in both figures is made of copper. The layer of core lacquer KL for instance is formed of polyurethane, the layer of baked lacquer B for instance is formed of polyvinylbutyral.

It is advantageous in the embodiment of FIG. 1b that in this way, smaller thicknesses of an electrically insulating layer iS, which acts as a dielectric between the conductor strip segments LA1, LA2 and is formed by the core lacquer KL and the baked lacquer B, respectively the core lacquer KL and the adhesive K, can be realized when the conductor strip segments LA1, LA2 are laid on top of each other, as shown in FIG. 2. As a result, larger capacitance values can be realized for the same surfaces of the conductor strip segments LA1, LA2 which are placed on top of each other.

FIG. 2 in a top view shows a conductor strip L laid on a substrate S, which forms a quasi-rectangular coil having two windings. The conductor strip L advantageously is laid such that the radii of the curves formed by the conductor strip L are greater than five times the width of the conductor strip, in order to enable proper laying and fixing of the conductor strip L on the substrate S without thereby damaging the same.

On a rectangular side, the coil windings, i.e. a first conductor strip segment LA1 and a second conductor strip segment LA2, are accurately placed on top of each other, wherein the second conductor strip segment LA2 lies on the first conductor strip segment LA1. A first coil end S1 crosses a coil winding and a second coil end S2 rectangularly, wherein the upper, second conductor strip segments LA2 in each case equally each lie on the lower, first conductor strip segments LA1.

The second conductor strip segments LA2 lying on the lower, first conductor strip segments LA1 are each completely and firmly joined to the lower, first conductor strip segments LA1 by forming an integral joint. In regions where the conductor strip segments LA1, LA2 are placed on top of each other, i.e. in so-called stacking regions, in the method for producing the circuit arrangement 1 having a prescribed capacitance, for instance a laying speed was reduced as a laying parameter, in order to enable joining of the conductor strip segments LA1, LA2 to each other.

The joining of the conductor strip segments LA1, LA2 in the method is performed by at least partially melting the baked lacquer B or the adhesive K at the conductor strips L and by pressing together the conductor strips L by applying force. When a UV-reactive adhesive K is used, a melting and/or curing of the adhesive K can be supported by UV radiation directly before and/or during laying of the conductor strip.

FIGS. 3a and 3b in a top view, respectively in a cross-sectional view along intersection lines IIIa-IIIa, show a circuit arrangement 1 having a rectangular coil formed by a laid conductor strip L, wherein in the method for producing the circuit arrangement 1, the conductor strips L were accurately laid on top of each other in a total of four windings, so that four conductor strip segments LA1, LA2, LA3, LA4 which are placed on top of each other are obtained. This results in a compact coil. FIG. 3c shows a corresponding detailed view thereof.

The substrate S, which is water-soluble in this exemplary embodiment, was removed subsequent to the laying of the conductor strip L, so that a self-supporting coil having a high parasitic capacitance and a low electrical resistance was produced. The conductor strip L in the example illustrated here has a thickness of 20 µm and a width of 500 µm. The core lacquer KL on all sides thereof has a thickness of 2 µm and the baked lacquer B has a thickness of 3 µm. This aspect results in a stack width of a conductor strip stack forming the coil of 510 µm and a stack height of 120 µm.

In FIG. 4, the conductor strips L were laid in windings side by side and on top of each other in such a manner that a compact, step-like shape of the circuit arrangement 1 is realized in the cross-section, wherein the formed coil for instance forms an antenna. In this context, it is advantageous that, when embedding the circuit arrangement 1 into thermoplastic foil, the coil is better pressed into the foil and the coil ends S1, S2 are not pressed over a high step. As a result, a risk of tearing of the coil ends S1, S2 is prevented.

FIGS. 5a and 5b show a top view of a possible capacitance correction of the circuit arrangement 1 during the method for the production thereof, in order to reach the prescribed electrical capacitance or to precisely set parameters of a resonant circuit formed by the coil and the prescribed electrical capacitance. In order to be able to precisely set the electrical capacitance or the resonant circuit parameters, a circuit pattern formed as a result of the laying of the conductor strip L in the production of the circuit arrangement 1 can be corrected by changing a crossing angle of the crossing conductor strip segments LA1, LA2.

In tendency-related values it is possible to correspondingly prescribe on the basis of current measured results the circuit pattern, i.e. the crossing angle of the circuit arrangement 1 to be produced and/or to measure the electrical capacitance or values derived therefrom in the case of fluctuating measurement results during laying of the conductor strip L, and to determine a precise crossing angle shortly before completion of the circuit arrangement 1. Hence, due to the inclined crossing angle in FIG. 5b, a surface overlap of the conductor strip segments LA1, LA2 is larger than in FIG. 5a with a right crossing angle. This aspect results in larger capacitor surfaces which are formed by the covered conductor strip segments LA1, LA2, whereby an increased electrical capacitance is obtained in the circuit arrangement 1 illustrated in FIG. 5b.

FIG. 6 in a top view shows a possible capacitive coupling of two circuit elements of a circuit arrangement 1. When the circuit elements are laid with different conductor strip widths, it is advantageous to firstly lay the wider conductor strips Lb as first conductor strip segments LA1 and to produce the overlap of the conductor strip segments LA1, LA2 with the narrower conductor strip Ls as second conductor strip segments LA2. The lower, wider conductor strip Lb, i.e. the first conductor strip segments LA1 as a conductor path can also be part of a printed, etched, laser-cut or milled conductor plate or conductor foil. On said conductor plates or conductor foils conductor strips Lb can be laid in addition to one-layered or else two-layered conductor plates.

FIGS. 7a and 7b in a top view, respectively in a cross-sectional view along intersection lines VIIb-VIIb, show a possibility of increasing the capacitance of conductor strip segments LA1, LA2, which are placed on top of each other, by deformation D of the conductor strip segments LA1, LA2, i.e. by flat-pressing of certain regions or segment lengths.

If a circuit arrangement 1 having a prescribed capacitance and very small tolerances is to be produced and if influencing factors have very large tolerances, for instance a thickness of the electrically insulating layer iS forming the dielectric between the conductor strip segments LA1, LA2, a width tolerance of the conductor strip segments LA1, LA2 or tolerances in the laying parameters, for instance a duration and/or an intensity of an UV radiation of the UV-reactive adhesive K during laying, a duration and/or an altitude of a heating temperature of a heating process of the adhesive K or the baked lacquer B with the aid of thermal energy and/or with the aid of ultrasound during laying and/or a duration and/or a level of a pressure, at which the conductor strip segments LA1, LA2 are pressed onto each other, so that the prescribed electrical capacitance of the circuit arrangement 1 cannot be reliably reached, the conductor strip L is laid such that the capacitance value is initially too low.

Following measurement of the capacitance value and subsequent to the laying of the conductor strip L, according to a determined difference between the measured capacitance value and the prescribed capacitance to be reached, a sufficient number of conductor strip segments LA1, LA2 are subsequently deformed, for instance with the aid of an unheated plunger (not shown here in greater detail), so that the prescribed electrical capacitance is reached.

A required pressure application for instance can be determined beforehand in trials. In another embodiment, the capacitance value can be determined anew, for instance subsequent to a correspondingly performed deformation D, so that the prescribed electrical capacitance can be gradually approached. By means of the deformation, the width of the conductor strip segments LA1, LA2 is increased with the plastic deformation of the conductor strip L and the electrically insulating layer iS, so that the capacitor surfaces are enlarged.

A thickness of the electrically insulating layer iS forming the dielectric here is only slightly reduced. The deformation D is performed preferably at ambient temperature. In order to prevent an extension of the conductor strip segments LA1, LA2, the plunger preferably is furnished with a very flat embossing, for instance with corrugations extending transversely to a laying direction of the conductor strip L.

FIGS. 8a to 8c in a top view, respectively in a cross-sectional view and in a detailed view, show a similar circuit arrangement as shown in FIG. 7. Here too, a capacitance correction is shown subsequent to the laying of the conductor strip L. In the exemplary embodiment shown here, this is performed by reducing the thickness of the electrically insulating layer iS forming the dielectric between the conductor strip segments LA1, LA2 which are placed on top of each other.

By pressing a heated plunger, where required, onto different regions of the conductor strip L or else by a simultaneous use of several heated plungers with a temperature larger than the softening temperature of the baked lacquer B, respectively the adhesive K, but smaller than a softening or damaging temperature of the core lacquer KL, the capacitance is increased by partially squeezing out the softened baked lacquer B or adhesive K between the conductor strip segments LA1, LA2, since the thickness of the electrically insulating layer iS forming the dielectric between the conductor strip segments LA1, LA2 is reduced and thereby a reduced thickness rD is obtained in said regions.

Here too, the required pressure parameters can be tested for instance beforehand in trials, in order to thereby obtain comparative values, or the reduction of the thickness of the electrically insulating layer iS can be performed gradually, wherein the capacitance value is respectively measured subsequently, so that the prescribed capacitance can be reached precisely.

In the cross-sectional views of FIG. 8b along intersection line VIIIb-VIIIb, respectively FIG. 8c, the change as a result of squeezing out the softened baked lacquer B or adhesive K is illustrated in greater detail. The right-hand side of the coil remains unchanged. The conductor strip L has a thickness of 20 µm. The coating with the core lacquer KL in each conductor strip segment LA1, LA2 on all sides thereof has a thickness of 2 µm. In the conductor strip segments LA1, LA2 on the right-hands side of the coil, which are not pressed together, the baked lacquer B of each conductor strip segment LA1, LA2 on all sides thereof has a thickness of 4 µm. This aspect results in a thickness of 12 µm of the electrically insulating layer iS acting as a dielectric between the conductor strip segments LA1, LA2.

On the left-hand side, two conductor strip segments LA1, LA2 are pressed together by heating with the aid of thermal energy and/or ultrasound and squeezing out of baked lacquer B by pressure application, so that the baked lacquer layer between the conductor strip segments LA1, LA2 is reduced to 2 µm for each conductor strip segment LA1, LA2. This aspect results in a reduction of the electrically insulating layer iS acting as a dielectric between the conductor strip segments LA1, LA2 by 4 µm to a reduced thickness rD of 8 µm, whereby the capacitance value of the circuit arrangement 1 is increased.

Another possible capacitance correction of the circuit arrangement 1 is shown in FIG. 9. In the example, a laid coil is shown, the extended ends thereof forming a number of crossings with the laid circuit and thereby producing additional partial capacitances TK. Said partial capacitances TK can be selectively separated from the circuit arrangement 1 by punching, laser cutting or micro-sandblasting, whereby the capacitance value of the circuit arrangement 1 is reduced.

Thus, in this embodiment of the method, the conductor strip L is laid in such a manner that firstly a capacitance value is obtained, which is larger than the prescribed electrical capacitance. Subsequent to the laying and a capacitance measurement of the circuit arrangement 1, a separation point T, where the conductor strip L needs to be separated, is determined from the difference between the measured capacitance value and the prescribed electrical capacitance in order to separate partial capacitances TK and to reach the prescribed electrical capacitance.

Here too, the partial capacitances TK for instance can be gradually separated, and subsequently the capacitance values of the circuit arrangement 1 can each be compared, in order to thereby gradually set the prescribed electrical capacitance of the circuit arrangement 1. In the illustrated example, in this way a resonance frequency which results from a module capacitance of a module 3 being integrated in the circuit arrangement 1, for instance a semiconductor chip, from the parasitic capacitance of the coil and from a coil inductance, can be set with very high accuracy.

This possibility of the capacitance adaptation of the circuit arrangement 1 is required, since capacitance tolerances of semiconductor chips as a general rule are relatively large, and thus a precisely produced coil alone does not ensure a satisfactory level of the resonance frequency. The coil formed by the laying of the conductor strip L in the illustrated example is laid on a substrate S of plastics, for instance polyvinylchloride. The module 3 is a semiconductor chip, the terminals thereof being welded to the conductor strip L, for instance by thermo-compression welding.

It is essential for the laying of the conductor strips L that the conductor strip L is supplied to a laying tool 4 of the device 2 for producing the circuit arrangement 1 without twisting. This is realized by a suspension device 5 for a conductor coil 6, shown in FIGS. 10a and 10b, wherein a coil receptacle 7 horizontally accommodating the conductor strip coil 6 is rotatably mounted about a vertical axis. By means of a tracker device (not illustrated), the coil receptacle 7 and thus the conductor strip coil 6 are rotated in a horizontal plane such that the surface of the conductor strip L always points into the advance direction of the laying tool 4 according to the circuit arrangement 1 to be produced on the substrate S.

FIGS. 10a and 10b show two situations with different directions of movement. In particular in the laying of coil-type or concentric circuit patterns, tracking of the coil receptacle 7, respectively the conductor strip coil 6, is absolutely necessary, in order to enable laying of the conductor strip L without twisting. The substrate positioning means 8 are only schematically illustrated. The conductor strip L can be laid on the substrate S by moving the laying tool 4 relative to the substrate S and/or by moving the substrate S relative to the laying tool 4 by means of the substrate positioning means 8.

The illustrated laying tool 4 is formed cylindrically or conically and at least over a part of its length has an interior bore 9, which guides the conductor strip L, and has an annular active area 10, which merges in inner and outer radius and which is arranged perpendicular to the longitudinal axis thereof. As a result, the conductor strip L can be passed through the laying tool 4 without twisting and can be optimally laid and fixed on the substrate S, respectively on the already laid conductor strip L.

Preferably, the laying tool 4 comprises an ultrasonic sonotrode and a converter. The ultrasound is directed preferably perpendicular to a surface of the substrate S. The laying tool 4 is always aligned perpendicular to a corresponding substrate section to be covered with the conductor strip L. With the aid of said laying tool 4, the conductor strip L, respectively the baked lacquer B or the adhesive K, which forms the electrically insulating layer iS between the conductor strip segments LA1, LA2 which are placed on top of each other, can be heated, and the conductor strip segments LA1, LA2 can be pressed against each other and against the substrate S, so that the conductor strip segments LA1, LA2 can be integrally and firmly joined to each other and/or to the substrate S, wherein a thickness of the insulating layer iS can be adjusted between the conductor strip segments LA1, LA2 according to the requirements in order reach the prescribed electrical capacitance.

FIG. 11 shows another embodiment of the device 2 for producing the circuit arrangement 1, which comprises a conductor strip guiding device 11. The conductor strip guiding device 11 is formed of two deflection rollers 12, which are firmly disposed one below the other in the conductor strip running direction, and one deflection roller 14, which can be deflected via a spring bearing 13 horizontally up to a maximum and adjustable position and which is fixed to the spring bearing 13 and thus is movably mounted. This aspect results in a conductor strip storage in such a manner that an increased tensional force, which is generated in the conductor strip L by a stop of the conductor strip flow during further laying of the conductor strip L, pushes the movable deflection roller 14 against the spring bearing 13 and thus releases additional conductor strip L for laying.

Moreover, in this embodiment of the device 2, an embossing device (not illustrated in greater detail) can also be disposed, which is already disclosed in as yet unpublished application DE 10 2009 012 255.9-33 of the applicant and which is incorporated herein by reference. Using such an embossing device, a patterned embossing can be printed into the conductor strip L prior to the laying of the conductor strip L. By means of the embossing process, the conductor strip L shortly comes to a stop, whereby the generated increased tensional force pushes the movable deflection roller 14 against the spring bearing 13 and thus additional conductor strip L is released for laying. When the conductor strip L can be traced again, the spring bearing 13 together with the movable deflection roller 14 in a damped fashion slides back into an adjustable maximum deflection position.

FIG. 12 in a schematic lateral view shows another embodiment of the device 2 for producing the circuit arrangement 1. The conductor strip L, which is still uncoated, can be unwound from the conductor strip coil 6 during laying. The device 2 illustrated here comprises means 15 for applying the adhesive K onto the conductor strip L prior to the laying. By means of this measure, the conductor strip L can be coated on one side thereof for instance with a liquid reactive adhesive K.

The adhesive K for instance can be applied from an opaque, cooled cartridge across a gap, via micro-nozzles or via an application roller onto the conductor strip L passing by. In another embodiment (not illustrated here in greater detail), the conductor strip L for instance is already coated with the adhesive K and is cooled in a deep-frozen environment until being laid. In another embodiment, the conductor strip L is already coated with the adhesive K which has a non-stick coating disposed thereon. Said non-stick coating can be removed from the adhesive K when the conductor strip L is unwound from the conductor strip coil 6.

Subsequently, the conductor strip L is guided across the resiliently mounted and/or horizontally movable deflection roller 14. If the deflection roller 14 is not resiliently mounted but is horizontally movable, a dimension of a wrapping of a subsequent heated pressure roller, which in this embodiment represents the laying tool 4, can be set prior to the laying of the conductor strip L. As a result, optimum heating of the conductor strip L, respectively of the baked lacquer B or the adhesive K, for initiating an adhesive reaction is always ensured as a function of the type of adhesive and the laying speed.

Moreover, the device 2, as illustrated here, can comprise an UV radiation device 16 for subjecting the conductor strip L to UV radiation directly before laying, in order to accelerate a bonding reaction of the adhesive K. Advantageously, the device 2 further comprises a cooling device 17 for the supply of cooled air to the laid conductor strip L. Hence, the reaction heat of the adhesive K can be discharged and a high laying efficiency can be ensured, since the conductor strip L can be laid very rapidly without a risk of detachment of already laid conductor strip L.

A force F acts on the device 2 perpendicular to the substrate S, so that the conductor strip L is unwound from the conductor strip coil 6 in the method for producing the circuit arrangement 1, where required, being coated with adhesive K, is guided along the laying tool 4 being formed as a pressure roller, and is thereby heated, wherein the adhesive K, where required, is reaction-excited by UV radiation. Subsequently, the conductor strip L is pressed onto the substrate S, respectively the already laid conductor strip L, with the aid of the laying tool 4, i.e. with the aid of the pressure roller, by the application of force onto the device 2, wherein the adhesive K or the baked lacquer B is integrally joined to the substrate S or the already laid conductor strip L. Hence, the conductor strip L is firmly disposed on the substrate, respectively on the already laid conductor strip L.

As is illustrated in FIG. 13, the laying tool 4, being configured as a pressure roller, at the circumference thereof has a guide groove 18 which is formed as a small groove-type indentation for guiding the conductor strip L. A depth of the guide groove 18 preferably is half the thickness of the conductor strip L which is not yet coated with the adhesive K, for instance 20 μm. The guide groove 18 serves for guiding the conductor strip L in radii of the circuit pattern, whereby the conductor strip L to be laid can be forced to undergo a required directional change.

LIST OF REFERENCE NUMERALS

1 Circuit arrangement
2 Device
3 Module
4 Laying tool
5 Suspension device
6 Conductor strip coil
7 Coil receptacle
8 Substrate positioning means
9 Interior bore
10 Active area
11 Conductor strip guiding device
12 Fixed deflection roller
13 Spring bearing
14 Movable deflection roller 15 Means for applying the adhesive
16 UV radiation device
17 Cooling device
18 Guide groove
B Baked lacquer
D Deformation
F Force
iS Electrically insulating layer
K Adhesive
C Core lacquer
L Conductor strip
LA1, LA2, LA3, LA4 Conductor strip segment
Lb Wide conductor strip
Ls Narrow conductor strip
rD Reduced thickness
S Substrate
S1, S2 Coil end
T Separation point
TK Partial capacitance

The invention claimed is:

1. A method for producing a circuit arrangement having a prescribed electrical capacitance, said method comprising:
    laying at least one metallic, electrically conductive conductor strip having a width of 100 μm to 1000 μm and a thickness of 5 μm to 40 μm on at least one surface side of a substrate;
    laying at least one first conductor strip segment forming part of the at least one conductor strip on the substrate; and
    at least partially laying at least one second conductor strip segment forming part of the at least one conductor strip on the first conductor strip segment, wherein an electrically insulating layer is disposed between the conductor strip segments, forming a dielectric, wherein the conductor strip segments are one of 1) partially placed on top of each other selectively and in a defined manner and/or 2) almost completely placed on top of each other, and integrally joined to each other.

2. The method according to claim 1, in which the electrically insulating layer is at least one of applied onto at least one surface side of at least one conductor strip segment and applied onto a region of the substrate to be covered with the second conductor strip segment prior to the laying of the conductor strip.

3. The method according to claim 1, including heating the electrically insulating layer, wherein said electrically insulating layer is at least one of at least partially melted and/or reaction-excited, wherein said heating is performed at least one of directly before laying and/or during laying of the second conductor strip segment on the first conductor strip segment, and said heating is performed with the aid of at least one of thermal energy, ultrasound, UV radiation and pressure.

4. The method according to claim 1, including pressing the second conductor strip segment onto the first conductor strip segment with a prescribed force.

5. The method according to claim 1, in which the conductor strip segments are laid on top of each other in such a manner that they form a coil having at least two windings, wherein the conductor strip segments of the coil are insulated against each other and placed on top of each other to form a resonant circuit having a prescribed electrical capacitance, a prescribed inductance, and a prescribed resonance frequency.

6. The method according to claim 1, in which the electrical capacitance is at least one of determined during laying and/or determined subsequent to laying.

7. The method according to claim 1, including at least one of prescribing laying parameters prior to the laying as a function of the prescribed electrical capacitance to be reached, controlling laying parameters during laying as a function of the prescribed electrical capacitance to be reached, and/or adjusting laying parameters during laying as a function of the prescribed electrical capacitance to be reached.

8. The method according to claim 7, in which the laying parameters are selected from a group consisting of a laying direction, a laying speed, a length of the laid conductor strip, a duration of UV radiation, an intensity of the UV radiation, a duration of a heating temperature of the heating with the aid of thermal energy, a level of a heating temperature of the heating with the aid of thermal energy, a duration of a heating temperature of the heating with the aid of ultrasound, a level of a heating temperature of the heating with the aid of ultrasound, a duration of the pressure, and a level of the pressure.

9. The method according to Claim 1, in which the conductor strip is laid such that the prescribed electrical capacitance is undershot within a prescribed tolerance range, and by subsequently performing a heating process by means of at least one of thermal energy and ultrasound, and pressure application onto at least one region where at least two conductor strip segments are laid on top of each other to reduce a thickness of the electrically insulating layer between the conductor strip segments to the extent that the prescribed electrical capacitance is reached by at least partially melting and squeezing out at least one of a baked lacquer and adhesive between the conductor strip segments.

10. The method according to claim 1, in which the conductor strip is laid such that the prescribed electrical capacitance is overshot within a prescribed tolerance range and a plurality of conductor strip segments, which are placed on top of each other, are formed on the substrate side by side, and a prescribed number of the conductor strip segments, which are placed on top of each other, are subsequently separated from the circuit arrangement by cutting the conductor strip, so that the prescribed electrical capacitance is reached.

11. A circuit arrangement having a prescribed electrical capacitance, said circuit arrangement comprising:
    a substrate having at least one metallic, electrically conductive conductor strip having a width of 100 μm to 1000 μm and a thickness of 5 μm to 40 μm;
    at least one first conductor strip segment forming part of the at least one conductor strip and disposed on the substrate; and
    at least one second conductor strip segment forming part of the at least one conductor strip at least partially disposed on the first conductor strip segment, wherein an electrically insulating layer is disposed between the conductor strip segments, forming a dielectric, the conductor strip segments being one of 1) partially placed on top of each other selectively and in a defined manner and /or 2) almost completely placed on top of each other, and integrally joined to each other.

12. The circuit arrangement according to claim 11, in which the conductor strip segments form a coil having at least two windings, wherein the conductor strip segments of the coil are insulated against each other and placed on top of each other to form a resonant circuit having a prescribed electrical capacitance, a prescribed inductance and a prescribed resonance frequency.

13. A device for producing a circuit arrangement-having a prescribed electrical capacitance, said device comprising:
    a substrate positioner positioning a substrate forming the circuit arrangement;
    a laying tool laying at least one first conductor strip segment from a conductor strip coil on the substrate and at least one second conductor strip segment at least partially laid on the first conductor strip segment with an electrically insulating layer disposed between the conductor strip segments, forming a dielectric, and a metallic, electrically conductive conductor strip having a width of 100 μm to 1000 μm and a thickness of 5 μm to 40 μm, wherein the conductor strip segments are one of 1) partially placed on top of each other selectively and in a defined manner and/or 2) almost completely placed on top of each other and integrally joined to each other, and at least one of the laying tool is moved relative to the substrate and the substrate is moved relative to the laying tool by the substrate positioner, wherein the laying tool can be aligned perpendicular to a corresponding substrate segment to be covered with the conductor strip.

14. The device according to claim 13, in which the conductor strip coil is mounted rotatably about a horizontal rotational axis in a coil receptacle rotatably mounted about a vertical rotational axis, wherein the coil receptacle can be additionally rotated by a tracker device to accommodate directional changes during laying of the conductor strip on the substrate such that the conductor strip can be unwound tangentially from the conductor strip coil without twisting.

15. The device according to claim 13, in which the laying tool is a pressure roller.

16. The device according to claim 13, in which the laying tool includes one of a cylindrical surface and/or a conical surface, and an interior bore is formed through at least a part of a length of the laying tool, said interior bore guiding the conductor strip, the laying tool further including an annular active area, which defined between an inner radius of the laying tool and an outer radius of the laying tool, said annular active area being perpendicular to a longitudinal axis of the laying tool.

* * * * *